United States Patent
Zhao

(10) Patent No.: US 9,898,990 B2
(45) Date of Patent: Feb. 20, 2018

(54) GATE DRIVING CIRCUIT AND DISPLAY PANEL

(71) Applicant: Wuhan China Star Optoelectronics Technology Co., Ltd., Wuhan, Hubei (CN)

(72) Inventor: Mang Zhao, Guangdong (CN)

(73) Assignee: WUHAN CHINA STAR OPTOELECTRONICS TECHNOLOGY CO., LTD, Wuhan, Hubei (CN)

(*) Notice: Subject to any disclaimer, the term of this patent is extended or adjusted under 35 U.S.C. 154(b) by 213 days.

(21) Appl. No.: 15/022,199

(22) PCT Filed: Feb. 22, 2016

(86) PCT No.: PCT/CN2016/074228
§ 371 (c)(1),
(2) Date: Mar. 15, 2016

(87) PCT Pub. No.: WO2017/124598
PCT Pub. Date: Jul. 27, 2017

(65) Prior Publication Data
US 2017/0323609 A1    Nov. 9, 2017

(30) Foreign Application Priority Data
Jan. 21, 2016  (CN) .......................... 2016 1 0040603

(51) Int. Cl.
*G09G 3/36*    (2006.01)
*H03K 17/687*    (2006.01)
*G02F 1/1345*    (2006.01)

(52) U.S. Cl.
CPC ....... *G09G 3/3677* (2013.01); *H03K 17/6871* (2013.01); *G02F 1/13454* (2013.01);
(Continued)

(58) Field of Classification Search
CPC .. G09G 3/3677; G09G 3/3696; G09G 3/3266; G09G 2300/0871; G09G 2310/08; G09G 2310/021; G09G 2310/0289
See application file for complete search history.

(56) References Cited

U.S. PATENT DOCUMENTS

| | | | |
|---|---|---|---|
| 2003/0085754 A1* | 5/2003 | Lim | G05F 1/465 327/540 |
| 2011/0158377 A1* | 6/2011 | Hsu | G09G 3/3677 377/79 |

(Continued)

FOREIGN PATENT DOCUMENTS

| | | |
|---|---|---|
| CN | 105118462 | * 12/2015 |
| CN | 105139816 | * 12/2015 |

*Primary Examiner* — Kenneth Bukowski
(74) *Attorney, Agent, or Firm* — Andrew C. Cheng

(57) ABSTRACT

A gate driving circuit is disclosed. The output circuit is connected with the input circuit and the pulling circuit at a first node, responding to scanning driving signal of previous stage to set the pulling circuit in a first status, using a first reference voltage level to set the first node at a first voltage, and held. The output circuit outputs scanning driving signal of current stage according to a first clock signal. The stabilizing circuit is connected with the pulling circuit at a second node, using the first reference voltage level to set the second node at the first voltage, and held. The pulling control circuit responds to a second clock signal to set the pulling circuit in a second status, using a second reference voltage level to pull voltages of the first and second nodes and to hold the voltages. Accordingly, a current leakage can be reduced.

19 Claims, 5 Drawing Sheets

(52) U.S. Cl.
   CPC ............ *G09G 2300/0426* (2013.01); *G09G 2300/0819* (2013.01); *G09G 2320/0219* (2013.01)

(56) References Cited

U.S. PATENT DOCUMENTS

| | | | | |
|---|---|---|---|---|
| 2011/0205481 | A1* | 8/2011 | Aruga | G09G 3/3648 349/151 |
| 2014/0219412 | A1* | 8/2014 | Chien | G11C 19/28 377/68 |
| 2015/0243367 | A1* | 8/2015 | Gu | G11C 19/28 377/64 |
| 2015/0255031 | A1* | 9/2015 | Cao | G09G 3/3648 345/210 |
| 2015/0346904 | A1* | 12/2015 | Long | G09G 3/3677 345/174 |
| 2016/0012911 | A1* | 1/2016 | Han | G09G 3/20 377/64 |
| 2016/0189795 | A1* | 6/2016 | Chen | G09G 3/20 377/70 |
| 2016/0293091 | A1* | 10/2016 | Wang | G09G 3/36 |
| 2017/0169783 | A1* | 6/2017 | Xiao | G09G 3/3677 |
| 2017/0193887 | A1* | 7/2017 | Wang | G09G 3/2092 |
| 2017/0256218 | A1* | 9/2017 | Dai | G09G 3/3677 |
| 2017/0301302 | A1* | 10/2017 | Zhao | G09G 3/3677 |

* cited by examiner

GATE DRIVING CIRCUIT AND DISPLAY PANEL

BACKGROUND OF THE INVENTION

1. Field of the Invention

The present invention relates to a display driving field, and more particularly to a gate driving circuit and a display panel.

2. Description of Related Art

Along with the fast development of the LTPS (Low Temperature Poly-silicon) technology, integrated circuit at periphery of the panel has also become focus of people's attention. One of the very important technology is the GOA (Gate Driver On Array, array substrate row driving) technology. Using the GOA technology to integrate the gate switching circuit on the array substrate of the liquid crystal display panel in order to save a gate driving integrated circuit so as to reduce the cost from material cost and the manufacturing process.

The gate switching circuit integrated on the array substrate using the GOA technology is also called as a gate driving circuit. In a traditional gate driving circuit, when controlling a gate scanning driving signal of an output circuit, a node connected with the output circuit required to be hold at a voltage magnitude within in certain time period in order to output the gate scanning driving signal when a clock signal pulse is inputted. If within the certain time period, the node connected with the output circuit cannot be held at the voltage magnitude because of the current leakage, the circuit will fail such that a normal gate scanning driving signal cannot be outputted.

SUMMARY OF THE INVENTION

The purpose of the present invention is to provide a gate driving circuit and a display panel in order to solve that the node connected with the output circuit cannot be held at a voltage magnitude within a certain time so as to cause the failure of the circuit.

In order to achieve the above purpose, a technology solution provided by the present invention is: a gate driving circuit, comprising:

an input circuit, an output circuit, a stabilizing circuit, a pulling circuit, a pulling control circuit, wherein the input circuit includes a first switching tube and a second switching tube, and the stabilizing circuit includes a third switching tube;

a first path terminal of the first switching tube is connected with a control terminal of the first switching tube and a control terminal of the second switching tube, and receives the scanning driving signal of the previous stage; a second path terminal of the first switching tube is connected with the pulling circuit, the first switching tube is turned on under an action of the scanning driving signal of the previous stage in order to transfer the scanning driving signal of the previous stage to the pulling circuit to set the pulling circuit in a first status;

a first path terminal of the second switching tube is connected with a first reference voltage level, a second path terminal of the second switching tube is connected with a first node, the first node is connected with the output circuit, the second switching tube is turned on under the action of the scanning driving signal of the previous stage such that the first reverence voltage level set the voltage of the first node as a first voltage, and the voltage of the first node is held by the output circuit such that the output circuit outputs a scanning driving signal of a current stage according to a first clock signal;

a second path terminal of the first switching tube simultaneously connects a control terminal of the third switching tube to receive the scanning driving signal of the previous stage, a first path terminal of the third switching tube connects the first reference voltage level, a second path terminal of the third switching tube connects the second node, the third switching tube is turned on under an action of the scanning driving signal of the previous stage such that the first reference voltage level sets a voltage of a second node as the first voltage, and the voltage of the second node is held by the third switching tube;

the pulling circuit is connected with the second path terminal of the second switching tube at the first node, the pulling circuit is connected with the second path terminal of the third switching tube at the second node, the pulling circuit connects the pulling control circuit, the pulling control circuit responds to a second clock signal to set the pulling circuit in a second status so as to use a second reference voltage level to pull the voltages of the first node and the second node and hold the voltages of the first node and the second node at a second voltage.

In order to achieve the above purpose, another technology solution provided by the present invention is: a gate driving circuit, comprising:

an input circuit, an output circuit, a stabilizing circuit, a pulling circuit and a pulling control circuit;

the output circuit is connected with the input circuit and the pulling circuit at a first node, the input circuit responds to a scanning driving signal of a previous stage to set the pulling circuit in a first status, using a first reference voltage level to set a voltage of the first node as a first voltage, and the voltage of the first node is held by the output circuit such that the output circuit outputs a scanning driving signal of a current stage according to a first clock signal;

the stabilizing circuit is connected with the pulling circuit at a second node, the input circuit responds to the scanning driving signal of the previous stage, using the first reference voltage level to set a voltage of the second node as the first voltage, and the voltage of the second node is held by the stabilizing circuit so as to reduce a leakage current between the first node and the second node; and the pulling control circuit responds to a second clock signal to set the pulling circuit in a second status in order to use a second reference voltage level to pull voltages of the first node and the second node and to hold the voltages of the first node and the second node at a second voltage.

Wherein, the input circuit includes a first switching tube and a second switching tube; a first path terminal of the first switching tube is connected with a control terminal of the first switching tube and a control terminal of the second switching tube, and receives the scanning driving signal of the previous stage; a second path terminal of the first switching tube is connected with the pulling circuit, the first switching tube is turned on under an action of the scanning driving signal of the previous stage in order to transfer the scanning driving signal of the previous stage to the pulling circuit to set the pulling circuit in the first status; and a first path terminal of the second switching tube is connected with the first reference voltage level, a second path terminal of the second switching tube is connected with the first node, the second switching tube is turned on under the action of the scanning driving signal of the previous stage such that the first reverence voltage level set the voltage of the first node as the first voltage, the second path terminal of the first switching tube is further connected with the stabilizing circuit, the first switching tube further transfer the scanning driving signal of the previous stage to the stabilizing circuit, controlling the stabilizing circuit to be turned on such that the first reference voltage level set the voltage of the second node as the first voltage, and the voltage of the second node is held by the stabilizing circuit.

Wherein, the first switching tube is a first transistor, the control terminal of the first switching tube corresponds to a gate electrode of the first transistor, the first path terminal and the second path terminal of the first switching tube respectively correspond to a source electrode and a drain electrode of the first transistor; the second switching tube is a second transistor, the control terminal of the second switching tube corresponds to a gate electrode of the second transistor, the first path terminal and the second path terminal of the second switching tube respectively correspond to a source electrode and a drain electrode of the second transistor.

Wherein, the input circuit further includes a third switching tube; a control terminal of the third switching tube is connected with the first reference voltage level or the second reference voltage level, a first path terminal of the third switching tube is connected with the second path terminal of the second switching tube, a second path terminal of the third switching tube is connected with the first node, the third switching tube is turned on under an action of the first reference voltage level or the second reference voltage level in order to stabilize the voltage of the first node.

Wherein, the third switching tube is a third transistor, the control terminal of the third switching tube corresponds to a gate electrode of the third transistor, the first path terminal and the second path terminal of the third switching tube respectively correspond to a source electrode and a drain electrode of the third transistor.

Wherein, the output circuit includes a switching tube and a bootstrap capacitor; a control terminal of the switching tube is connected with the first node, a first path terminal of the switching tube inputs the first clock signal, the bootstrap capacitor is connected between the control terminal of the switching tube and a second path terminal of the switching tube; when the voltage of the first node is set as the first voltage, the bootstrap capacitor holds the first voltage such that the switching tube is turned on so that the scanning driving signal of the current stage is outputted at the second path terminal of the switching tube according to the first clock signal.

Wherein, the switching tube is a transistor, the control terminal of the switching tube corresponds to a gate electrode of the transistor, the first path terminal and the second path terminal of the switching tube respectively correspond to a source electrode and a drain electrode of the transistor.

Wherein, the stabilizing circuit includes a switching tube; a control terminal of the switching tube is connected with the input circuit to receive the scanning driving signal of the previous stage, a first path terminal of the switching tube is connected with the first reference voltage level, a second path terminal of the switching tube is connected with the second node, the switching tube is turned on under the action of the scanning driving signal of the previous stage such that the first reference voltage level set the voltage of the second node as the first voltage, and the voltage of the second node is held by the switching tube.

Wherein, the switching tube is a transistor, the control terminal of the switching tube corresponds to a gate electrode of the transistor, the first path terminal and the second path terminal of the switching tube respectively correspond to a source electrode and a drain electrode of the transistor.

Wherein, the stabilizing circuit further includes another switching tube; a first path terminal of the t another switching tube is connected with the second node and the control terminal of the another switching tube, and a second path terminal of the another switching tube is connected with the input circuit to receive the scanning driving signal of the previous stage, the another switching tube is turned on when the voltage of the second node is set as the first voltage, the another switching tube and the switching tube commonly hold the first voltage.

Wherein, the another switching tube is another transistor, the control terminal of the another switching tube corresponds to a gate electrode of the another transistor, the first path terminal and the second path terminal of the another switching tube respectively correspond to a source electrode and a drain electrode of the another transistor.

Wherein, the pulling circuit includes a first switching tube, a second switching tube, a third switching tube, a fourth switching tube and a bootstrap capacitor; a first path terminal of the first switching tube is connected with the second node, a second path terminal of the first switching tube is connected with the first node, and a control terminal of the first switching tube is connected with a third node; a control terminal of the second switching tube is connected with the input circuit to receive the scanning driving signal of the previous stage, a first path terminal of the second switching tube is connected with the third node, a second path terminal of the second switching tube is connected with the second reference voltage level; a control terminal of the third switching tube is connected with the third node, a first path terminal of the third switching tube is connected with the second node, and a second path terminal of the third switching tube is connected with the second reference voltage level; a control terminal of the fourth switching tube is connected with the third node, a first path terminal of the fourth switching tube is connected with an output terminal of the output circuit, a second path terminal of the fourth switching tube is connected with the second reference voltage level; the bootstrap capacitor is connected between the third node and the second reference voltage level; wherein, the second switching tube is turned on under an action of the scanning driving signal of the previous stage such that the second reference voltage level sets a voltage of the third node as the second voltage, the first switching tube, the third switching tube and the fourth switching tube are turned off under an action of the third node such that the first voltage of the first node is held in the output circuit, and the first voltage of the second node is held in the stabilizing circuit; the pulling control circuit responds to the second clock signal to set the voltage of the third node as the first voltage such that the first switching tube, the third switching tube and the fourth switching tube are turned on such that the second reference voltage level sets the voltages of the first node and the second node as the second voltage.

Wherein, the first switching tube is a first transistor, the control terminal of the first switching tube corresponds to a gate electrode of the first transistor, the first path terminal and the second path terminal of the first switching tube respectively correspond to a source electrode and a drain electrode of the first transistor; the second switching tube is a second transistor, the control terminal of the second switching tube corresponds to a gate electrode of the second transistor, the first path terminal and the second path terminal of the second switching tube respectively correspond to a source electrode and a drain electrode of the second transistor; the third switching tube is a third transistor, the control terminal of the third switching tube corresponds to a gate electrode of the third transistor, the first path terminal and the second path terminal of the third switching tube respectively correspond to a source electrode and a drain electrode of the third transistor; and the fourth switching tube is a fourth transistor, the control terminal of the fourth switching tube corresponds to a gate electrode of the fourth transistor, the first path terminal and the second path terminal of the fourth switching tube respectively correspond to a source electrode and a drain electrode of the fourth transistor.

Wherein, the pulling control circuit includes a fifth switching tube and a sixth switching tube; a first path terminal of the fifth switching tube is connected with the third node, a second path terminal of the fifth switching tube is connected with the first reference voltage level, a first path terminal of the sixth switching tube is connected with the stabilizing circuit, a second path terminal of the sixth switching tube is connected with the second reference voltage level, a control terminal of the fifth switching tube and a control terminal of the sixth switching tube receive the second clock signal; the sixth switching tube is turned on under an action of the second clock signal such that the second reference voltage level control the stabilizing circuit to remove holding of the first voltage through the sixth switching tube; and the fifth switching tube is turned on under the action of the second clock signal such that the first reference voltage level set the voltage of the third node as the first voltage through the fifth switching tube such that the first switching tube, the third switching tube and the fourth switching tube are turned on so as to use the second reference voltage level to set the voltages of the first node and the second node as the second voltage.

Wherein, the fifth switching tube is a fifth transistor, the control terminal of the fifth switching tube corresponds to a gate electrode of the fifth transistor, the first path terminal and the second path terminal of the fifth switching tube respectively correspond to a source electrode and a drain electrode of the fifth transistor; and the sixth switching tube is a sixth transistor, the control terminal of the sixth switching tube corresponds to a gate electrode of the sixth transistor, the first path terminal and the second path terminal of the sixth switching tube respectively correspond to a source electrode and a drain electrode of the sixth transistor.

Wherein, the first reference voltage level is one of a high reference voltage level and a low reference voltage level, and the second reference voltage level is the other of the high reference voltage level and the low reference voltage level.

Wherein, the first voltage is one of a high voltage level and a low voltage level, and the second voltage is the other of the high voltage level and the low voltage level In order to achieve the above purpose, another technology solution provided by the present invention is: a display panel comprising a substrate and a gate driving circuit as claimed in claim 1 on the substrate.

The beneficial effects of the present invention are, comparing with the conventional art, the input circuit responds to the scanning driving signal of the previous stage to set the pulling circuit as the first status, and utilizes the first reference voltage level to set the voltage of the first node at the first voltage, and held by the output circuit. The input circuit responds to the scanning driving signal of the previous stage, using the first reference voltage level to set the voltage of the second node as the first voltage, and held by the stabilizing circuit such that the output circuit output the scanning driving signal of the current stage according to the first clock signal. Through above way, the present invention set the voltage of the first node at the first voltage, and set the voltage of the second node at the same time in order to reduce the leakage current between the first node and the second node such that the voltage of the first node can be held at a magnitude within a certain time by the output circuit. When the clock signal is inputted, outputting the scanning driving signal of the current stage to reduce the failure risk of the circuit.

DETAILED DESCRIPTION OF THE PREFERRED EMBODIMENT

In order to let the person skilled in the art to understand the technology solution of the present invention better, the following combines figures and specific embodiments to describe the gate driving circuit and the display panel provided by the present invention in detail.

Figure 1:
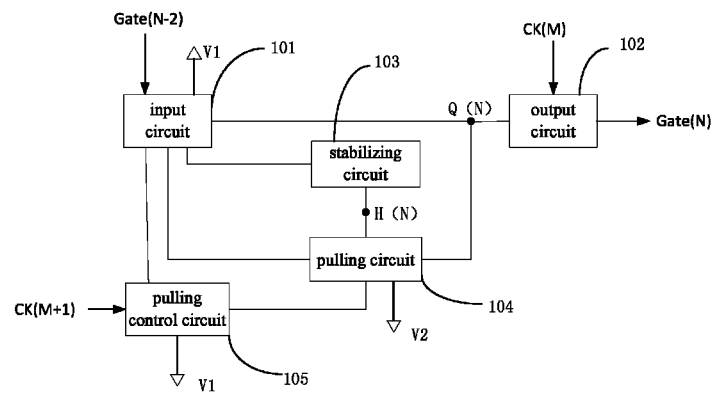
FIG. 1 is a principle schematic diagram of a gate driving circuit of a first embodiment of the present invention.

As shown in FIG. 1, the gate driving circuit of the present invention includes: an input circuit 101, an output circuit 102, a stabilizing circuit 103, a pulling circuit 104 and a pulling control circuit 105.

The output circuit 102 is connected with the input circuit 101 and the pulling circuit 104 at a first node Q(N). The input circuit 101 responds to a scanning driving signal Gate(N-2) of a previous stage to set the pulling circuit 104 in a first status, using a first reference voltage level V1 to set a voltage of the first node Q(N) as a first voltage, and the voltage of the first node Q(N) is held by the output circuit 102 such that the output circuit 102 outputs a scanning driving signal Gate(N) of a current stage according to a first clock signal CK(M).

The stabilizing circuit 103 is connected with the pulling circuit 104 at a second node H(N). The input circuit 101 responds to the scanning driving signal Gate(N-2) of the previous stage, using the first reference voltage level V1 to set a voltage of the second node H(N) as the first voltage, and the voltage of the second node H(N) is held by the stabilizing circuit 103 so as to reduce a leakage current between the first node Q(N) and the second node H(N).

The pulling control circuit 105 responds to a second clock signal CK(M+1) to set the pulling circuit 104 in a second status in order to use a second reference voltage level V2 to pull voltages of the first node Q(N) and the second node H(N) and to hold the voltages of the first node Q(N) and second node H(N) at a second voltage.

Specifically, the circuit of the present first embodiment adopts the scanning driving signal Gate(N-2) of the previous stage as a starting signal, under an action of the first clock signal CK(M), outputting the scanning driving signal Gate (N) of the current stage. Under an action of the scanning driving signal Gate(N) of the current stage, after a switch of a row of the scanning driving signal Gate(N) is written into a pixel, the scanning driving signal Gate(N) of the current stage is required to be restored in a normal status such that the switch of the row is maintained to be turned off. The pulling control circuit 105 is required to be responded to the second clock signal CK(M+1) to set the pulling circuit 104 in a second status so as to use the second reference voltage level V2 to pull the voltages of the first node Q(N) and the second node H(N) and to be held at the second voltage such that the voltage of the scanning driving signal Gate(N) of the current stage is held at the second voltage. The second voltage makes the switch of the scanning row to be held to be turned off.

Wherein, the scanning driving signal Gate(N-2) of the previous stage of the present first embodiment is a scanning driving signal that is two stages before the scanning driving signal Gate(N) of the current stage. In another embodiment, the scanning driving signal of the previous stage can be selected as a scanning driving signal that is some stages before the scanning driving signal of the current stage, or be selected as a scanning driving signal that is some stages after the scanning driving signal of the current stage, and the number of the stages is not limited. The first clock signal CK(M) and the second clock signal CK(M+1) can select a high frequency clock signal or a low frequency clock signal.

In a traditional circuit, a node connected with the output circuit (similar to the first node of the present first embodiment) is set to have a voltage having a certain magnitude in order to output a scanning driving signal of a current stage when a clock signal is inputted. If the node connected with the output circuit cannot be held at a same voltage or store a voltage, at this time, if the current leakage characteristic of the switch at the node connected with the output circuit is not good, the voltage of the node of the output circuit cannot be held at a certain magnitude. When the clock signal is inputted, the node connected with the output circuit make the output circuit to be fail, the gate scanning driving signal cannot output normally so as to cause the failure of the circuit.

In the present first embodiment, the first node Q(N) that is connected with the input circuit 101, the output circuit 102 and the pulling circuit 104 is a node for controlling an output of the scanning signal Gate(N) of the current stage. The second node H(N) that is connected between the stabilizing circuit 103 and the pulling circuit 104 is a node for preventing a current leakage. The input circuit 101 is firstly required to respond to a scanning driving signal of a previous stage to set the pulling circuit 104 in a first status for preparing the setting of the voltages of the first node Q(N) and the second node H(N) and the holding of the voltages after set. When the input circuit 101 inputs the scanning driving signal of the previous stage to make the voltage of the first node Q(N) to be set at a first voltage by the first reference voltage V1, the input circuit 101 also set the voltage of the second node H(N) at the first voltage by the first reference voltage V1 through the stabilizing circuit 103 so that the voltage of the first node Q(N) is the same as the voltage of the second node H(N). The current leakage is almost not existed between the two nodes, and the voltage of the first node Q(N) in the output circuit can be held. Through the above way, the risk of the circuit failure is greatly decreased.

Wherein, in a preferred embodiment, the first reference voltage V1 is one of a high reference voltage level VGH and a low reference voltage level VGL. The second reference voltage level V2 is the other of the high reference voltage level VGH and the low reference voltage level VGL. That is, if the first reference voltage level V1 is the high reference voltage level VGH, the second reference voltage level V2 is the low reference voltage level VGL. If the first reference voltage level V1 is the low reference voltage level VGL, the second reference voltage level V2 is the high reference voltage level VGH. The first reference voltage level V1 and the second reference voltage level V2 are used to set the first voltage as one of the high voltage level and the low voltage level, and set the second voltage as the other of the high voltage level and the low voltage level.

The switching tube of the gate driving circuit usually adopts a thin-film transistor. The thin-film transistor has two types, one is a P type device (PMOS) using holes to conduct, the other is an N type device (NMOS) using electrons to conduct.

Figure 2:
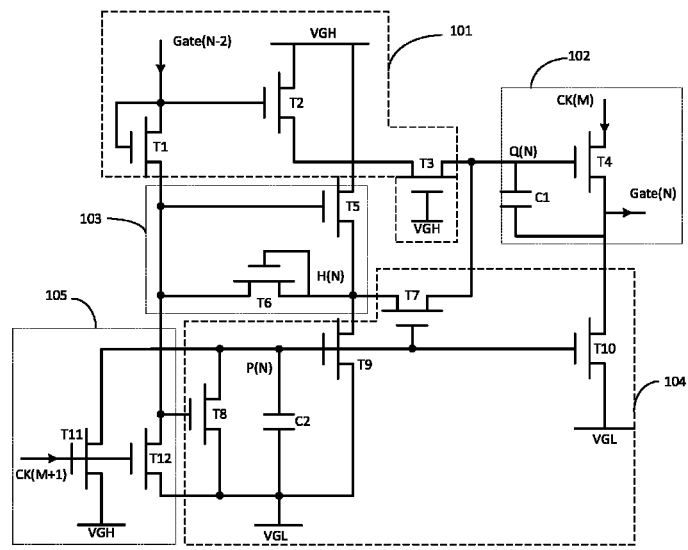
FIG. 2 is a specific circuit diagram of the gate driving circuit of the first embodiment of the present invention.

In one application of the present first embodiment, as shown in FIG. 2, using NMOS type device to design an integrated NMOS gate driving circuit as an example for specifically describing. Wherein, a control terminal of each switching tube corresponds to a gate electrode of the NMOS transistor. A first path terminal and a second path terminal respectively correspond to a source electrode and a drain electrode of the NMOS transistor. In another embodiment, the location of the source electrode and the drain electrode of the NMOS transistor can be exchanged according to a requirement.

Specifically, the input circuit 101 includes a transistor T1, a transistor T2 and a transistor T3; a source electrode of the transistor T1 is connected with a gate electrode of the transistor T1 and a gate electrode of the transistor T2, and receives the scanning driving signal Gate(N-2) of the previous stage. A drain electrode of the transistor T1 is connected with the pulling circuit 104 and the stabilizing circuit 103; a source electrode of the transistor T2 is connected with the first reference voltage level VGH, a drain electrode of the transistor T2 is connected with a source electrode of the transistor T3, a drain electrode of the transistor T3 is connected with the first node Q(N), a gate electrode of the transistor T3 is connected with the first reference voltage level V1, the first reference voltage V1 is the high reference voltage level VGH;

The input circuit 101 realizes the input of a scanning driving stage transferring signal, realizes the setting of the first node Q(N) and the second node H(N), and realizes the setting of the first status of the pulling circuit 104. Wherein, the transistor T3 provides a voltage stabilizing function.

The output circuit 102 includes a transistor T4 and a bootstrap capacitor C1;

A gate electrode of the transistor T4 is connected with the first node Q(N), a source electrode of the transistor T4 inputs the first clock signal CK(M), the bootstrap capacitor C1 is connected between the gate electrode of the transistor T4 and a drain electrode of the transistor T4. When the voltage of the first node Q(N) is set as the first voltage, the bootstrap capacitor C1 holds the first voltage such that the transistor T4 is turned on so that the scanning driving signal Gate(N) of the current stage is outputted at the drain electrode of the transistor T4 according to the first clock signal CK(M).

The stabilizing circuit 103 includes a transistor T5 and a transistor T6;

A gate electrode of the transistor T5 is connected with the drain electrode of the transistor T1 to receive the scanning driving signal Gate (N-2) of the previous stage, a source electrode of the transistor T5 is connected with the first reference voltage level VGH, a drain electrode of the transistor T5 is connected with the second node H(N), a source electrode of the transistor T6 is connected with the second node H(N) and the gate electrode of the transistor T6, and the drain electrode of the transistor T6 is connected with the drain electrode of the transistor T1.

Wherein, in another embodiment, the transistor T6 in the stabilizing circuit 103 can be removed.

The pulling circuit 104 includes a transistor T7, a transistor T8, a transistor T9, a transistor T10 and a bootstrap capacitor C2;

A source electrode of the transistor T7 is connected with the second node H(N), a drain electrode of the transistor T7 is connected with the first node Q(N), and a gate electrode of the transistor T7 is connected with a third node P(N); a gate electrode of the transistor T8 is connected with the drain of the transistor T1 to receive the scanning driving signal Gate(N-2) of the previous stage, a drain electrode of the transistor T8 is connected with the second reference voltage level V2, and the second reference voltage level V2 is a low reference voltage level VGL; a gate electrode of the transistor T9 is connected with the third node P(N), a source electrode of the transistor T9 is connected with the second node H(N), and a drain electrode of the transistor T9 is connected with the second reference voltage level VGL; a gate electrode of the transistor T10 is connected with the third node P(N), a source electrode of the transistor T10 is connected with the drain electrode of the transistor T4, a drain electrode of the transistor T10 is connected with the second reference voltage level VGL; A bootstrap capacitor C2 is connected between the third node P(N) and the second reference voltage level VGL.

The pulling control circuit 105 includes a transistor T11 and a transistor T12; a source electrode of the transistor T11 is connected with the third node P(N), a drain electrode of the transistor T11 is connected with the first reference voltage level VGH, a source electrode of the transistor T12 is connected with the drain electrode of the transistor T5, a drain electrode of the transistor T12 is connected with the second reference voltage level VGL, a gate electrode of the transistor T11 and a gate electrode of the transistor T12 receive the second clock signal CK(M+1).

In the above circuit, the first reference voltage level VGH can select a constant positive voltage level, and the second reference voltage level VGL can select a constant negative voltage level.

Figure 3:
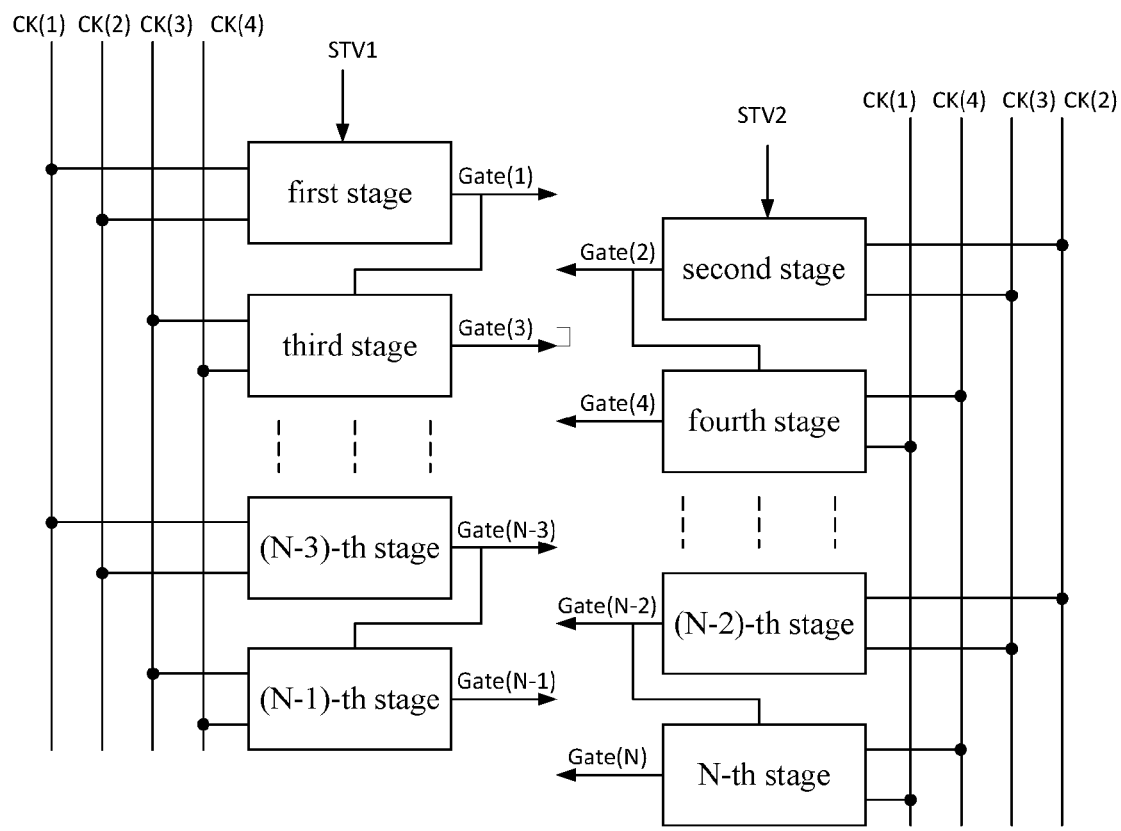
FIG. 3 is a driving architecture of the gate driving circuit of the first embodiment of the present invention.

The first clock signal CK(M) and the second clock signal CK(M+1) are two clock signals selected from four clock signals of a same group. For example, CK(1), CK(2), CK(3) and CK(4) are four alternate and circular clock signals included in a same clock signal CK(M), and are all low frequency clock signals. As shown in FIG. 3, and FIG. 3 is a driving architecture of the gate driving circuit of the first embodiment. If the clock signals CK(M) and CK(M+1) adopted by a scanning driving signal Gate(1) of a first stage correspond to CK(1) and CK(2), the clock signals CK(M) and CK(M+1) adopted by a scanning driving signal Gate(2) of a second stage correspond to CK(2) and CK(3), the clock signals CK(M) and CK(M+1) adopted by a scanning driving signal Gate(3) of a third stage correspond to CK(3) and CK(4), and the clock signals CK(M) and CK(M+1) adopted by a scanning driving signal Gate(4) of a fourth stage correspond to CK(4) and CK(1), and are alternate and circular.

Besides, it can be seen from FIG. 3, the scanning driving signal Gate(N) of the current stage adopts a scanning driving signal Gate(N-2) that is two stages before the Gate(N) as an input starting signal for operating. However, in the connection relationship of the scanning driving signal Gate(1) of the first stage and the scanning driving signal Gate(2) of the second stage, a scanning driving signal which is two stages before the scanning driving signal Gate(1) and the scanning driving signal Gate(2) cannot be used. Therefore, in the connection relationship of the scanning driving signal Gate (1) of the first stage of the present first embodiment, the gate electrode and the source electrode of the transistor T1 are connected with an input starting signal STV1. In the connection relationship of the scanning driving signal Gate(2) of the second stage, the gate electrode and the source electrode of the transistor T1 are connected with an input starting signal STV2. The starting signals STV1 and STV2 provide high voltage level pulse to start the circuit.

Figure 4:
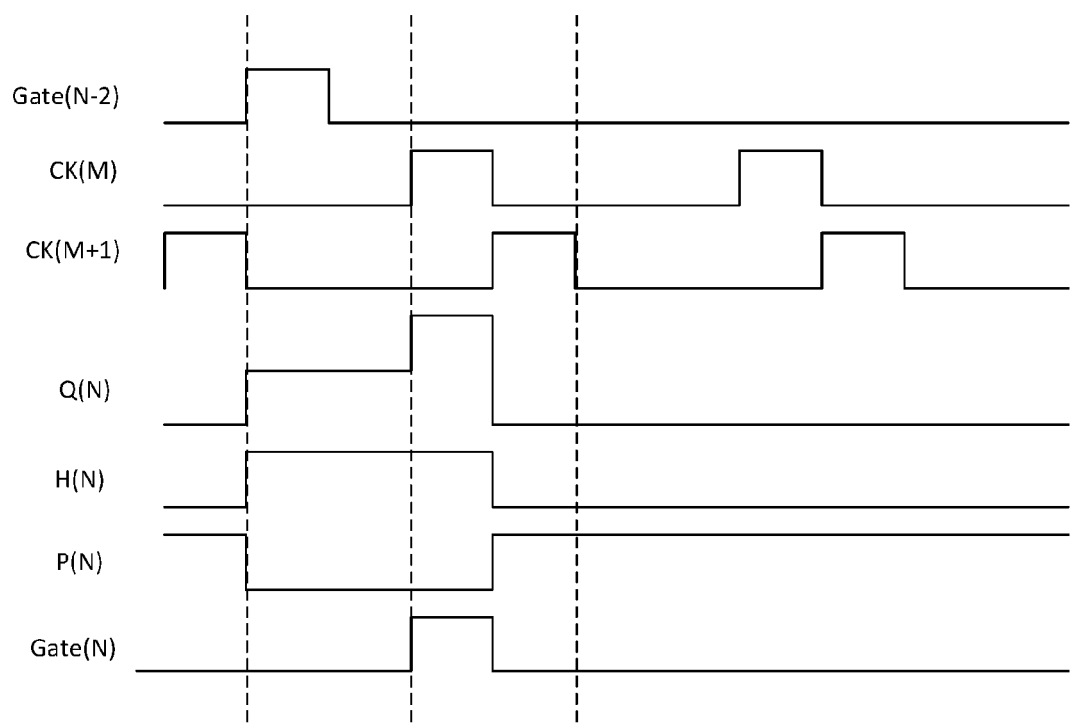
FIG. 4 is a timing diagram of the gate driving circuit of the first embodiment of the present invention.

FIG. 4 is a timing diagram of the gate driving circuit of the first embodiment of the present invention. Combined with FIG. 2, a specific operation process of the present first embodiment is:

When a high voltage level of a scanning driving signal Gate(N-2) of a previous stage is inputted, the transistor T1 and the transistor T2 are turned on. Because the gate electrode of the transistor T3 is connected with the high voltage level of the first reference voltage level VGH, which is under a normal conductive status, the high voltage level of the first reference voltage level VGH set the voltage of the first node Q(N) as a first voltage through the transistor T2 and the transistor T3, and the first voltage is at a high voltage level;

When the high voltage level of the scanning driving signal Gate(N-2) of the previous stage makes the gate electrode of the transistor T5 to be at a high voltage level through the transistor T1, the transistor T5 is turned on. The high voltage level of the first reference voltage level VGH sets the voltage of the second node H(N) as the first voltage, that is the high voltage level, through the transistor T5, the transistor T6 is turned on. The high voltage level of the scanning driving signal Gate(N-2) of the previous stage continues to speed up the rise of the voltage level of the second node H(N) through the transistor T6. The high voltage level of the second node H(N) is stored and held by the transistor T5 and the transistor T6;

The high voltage level of the scanning driving signal Gate(N-2) of the previous stage makes the gate electrode of the transistor T8 at a high voltage level through the transistor T1, the transistor T8 is turned on, the third node P(N) is pulled down to the second voltage by the second reference voltage level VGL, the second voltage is a low voltage level, and the transistor T7, the transistor T9 and the transistor T10 are turned off. At this time, the second clock signal CK(M+ 1) is also at a low voltage level, the transistor T11 and the transistor T12 are turned off, and the pulling circuit 104 is held in a first status;

After the high voltage level of the scanning driving signal Gate(N-2) of the previous stage finishes operation, the transistor T1 and the transistor T2 are turned off, the pulling circuit 104 has been set in the first status, the transistor T7 and the transistor T9 are turned off, the voltage of the first node Q(N) can be held at a high voltage level. It can be seen from FIG. 4, during waiting for the first clock signal CK(M), the high voltage level of the first node Q(N) should be held in a period of two clock pulses, the circuit of the first clock signal of the present first embodiment, adding a second node H(N) to store a voltage level based on the conventional circuit such that the source electrode of the transistor T2 and the source electrode of the transistor T7 connected with the first node Q(N) are both at a high voltage level, the current leakage path does not exist, reducing the risk of the circuit failure;

During the high voltage level of the first node Q(N) is held, the transistor T4 is turned on, when the high voltage level of the first clock signal CK(M) is inputted, the voltage level of the first node Q(N) will continue to increase because of the bootstrap function of the bootstrap capacitor C1, and outputting the high voltage level of the scanning driving signal Gate(N) of the current stage through the transistor T4.

When the operation of the high voltage level of the first clock signal CK(M) is finished, a high voltage level of the second clock signal CK(M+1) is inputted, the transistor T11 and the transistor T12 are turned on, the drain electrode of the transistor T1 is pulled down to the low voltage level of the second voltage by the second reference voltage level VGL through the transistor T12, the transistor T5 and the transistor T8 are turned off, the high voltage level of the first reference voltage VGH sets the third node P(N) as the high voltage level of the first voltage through the transistor T11, at this time, the pulling circuit is in a second status.

The high voltage level of the third node P(N) make the transistor T9 and the transistor T7 to be turned on, the first node Q(N) is pulled down to the low voltage level by the second reference voltage level VGL through the transistor T7 and the transistor T9, the second node H(N) is pulled down to the low voltage level by the second reference voltage level VGL through the transistor T9, the low voltage level of the second node H(N) is not enough to turn off the transistor T6, the low voltage level of the source electrode of the transistor T6 will speed up the pulldown of the voltage level of the second node H(N).

The high voltage level of the third node P(N) simultaneously turns on the transistor T10, the scanning driving signal Gate(N) of the current stage is pulled down to the low voltage level by the second reference voltage level VGL. Thus, one timing cycle of the complete circuit is finished.

In the second embodiment of the gate driving circuit of the present invention, using PMOS gate driving circuit designed and integrated by PMOS device to specifically describe. Wherein, a control terminal of each switching tube corresponds to a gate electrode of the PMOS transistor, a first path terminal and a second path terminal respectively correspond to a source electrode and a drain electrode of the PMOS transistor.

Figure 5:
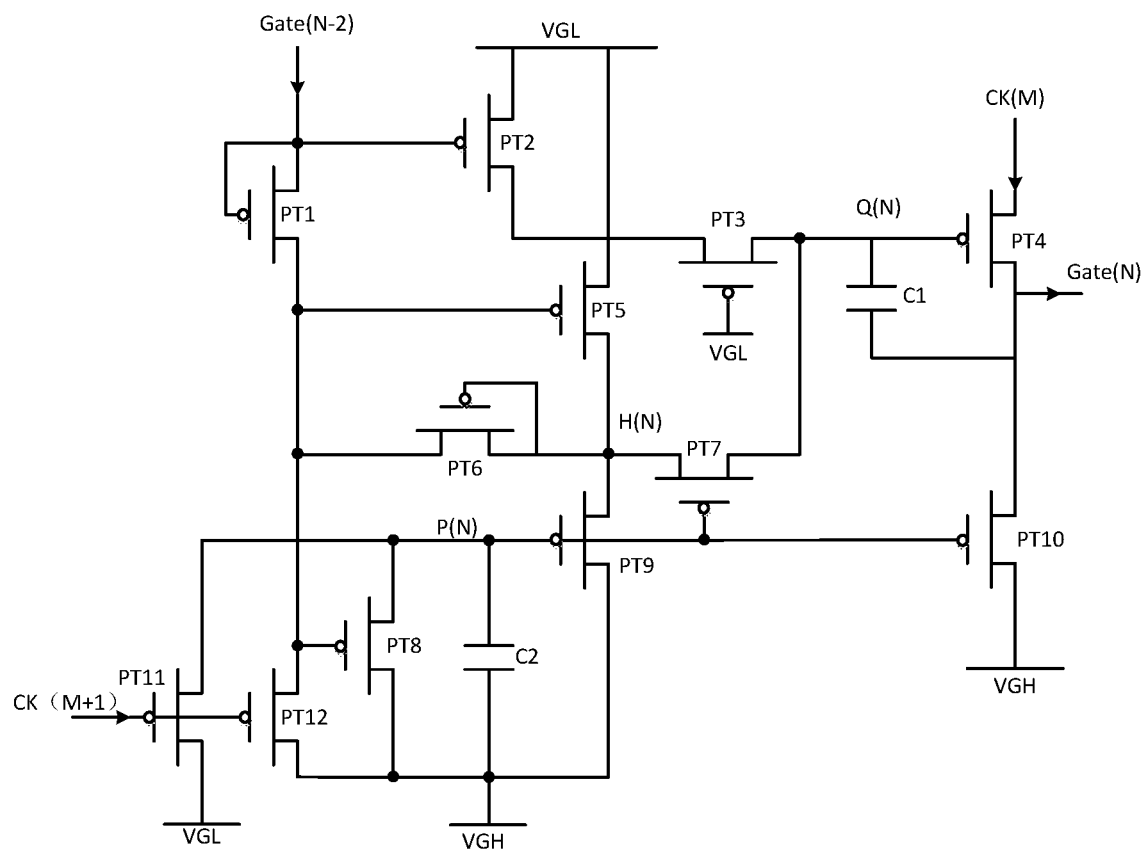
FIG. 5 is a specific circuit diagram of a gate driving circuit of a second embodiment of the present invention.

With reference to FIG. 5, the difference between the second embodiment and the first embodiment in FIG. 2 is, replacing all of the NMOS transistors to PMOS transistors, the first reference voltage level is the low reference voltage level VGL, the second reference voltage level is the high reference level VGH, the circuit structure is similar to the first embodiment, not repeating anymore.

Figure 6:
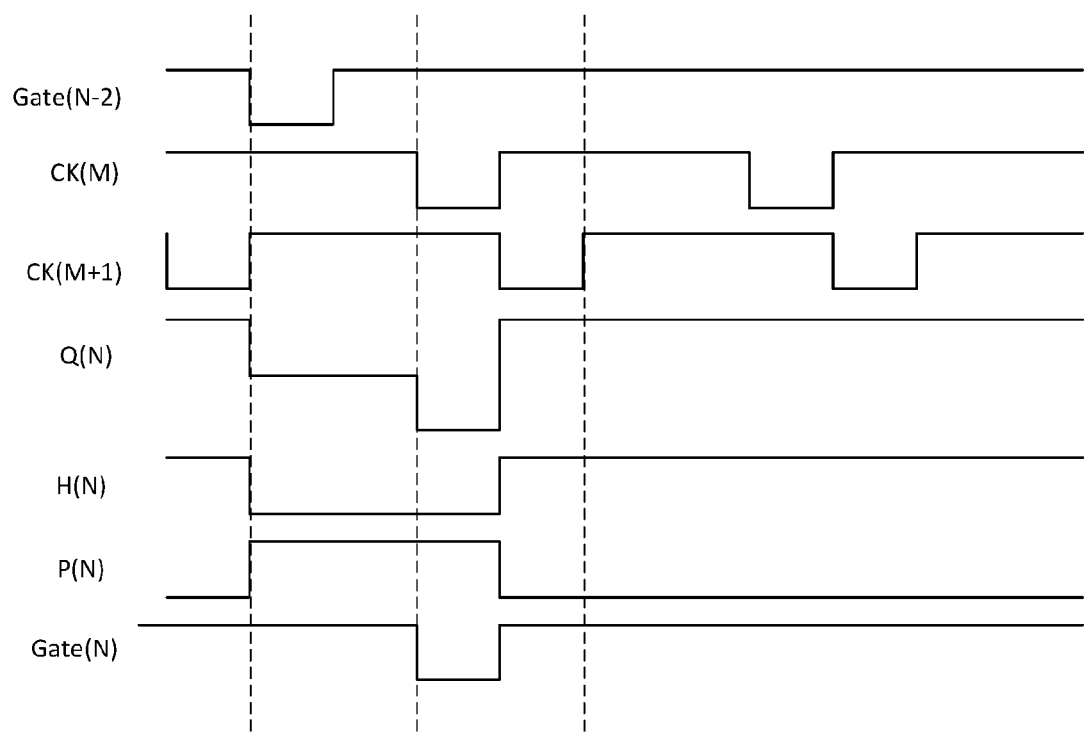
FIG. 6 is a timing diagram of the gate driving circuit of the second embodiment of the present invention.

FIG. 6 is a timing diagram of the gate driving circuit of the second embodiment of the present invention. Combined with FIG. 5, a specific operation process of the PMOS gate driving circuit of the present second embodiment is:

When a low voltage level of a scanning driving signal Gate(N-2) of a previous stage is inputted, the transistor PT1 and the transistor PT2 are turned on. Because the gate electrode of the transistor PT3 is connected with the low voltage level of the first reference voltage level VGL, which is under a normal conductive status, the low voltage level of the first reference voltage level VGL set the voltage of the first node Q(N) as a first voltage through the transistor PT2 and the transistor PT3, and the first voltage is at a low voltage level;

When the low voltage level of the scanning driving signal Gate(N-2) of the previous stage makes the gate electrode of the transistor PT5 to be at a low voltage level through the transistor PT1, the transistor PT5 is turned on. The low voltage level of the first reference voltage level VGL sets the voltage of the second node H(N) as the first voltage, that is the low voltage level, through the transistor PT5, the transistor PT6 is turned on. The low voltage level of the scanning driving signal Gate(N-2) of the previous stage continues to speed up the fall of the voltage level of the second node H(N) through the transistor PT6. The low voltage level of the second node H(N) is stored and held by the transistor PT5 and the transistor PT6;

The low voltage level of the scanning driving signal Gate(N-2) of the previous stage makes the gate electrode of the transistor PT8 at a low voltage level through the transistor PT1, the transistor PT8 is turned on, the third node P(N) is pulled up to the second voltage by the second reference voltage level VGH, the second voltage is a high voltage level, and the transistor PT7, the transistor PT9 and the transistor PT10 are turned off. At this time, the second clock signal CK(M+1) is also at a high voltage level, the transistor PT11 and the transistor PT12 are turned off;

After the low voltage level of the scanning driving signal Gate(N-2) of the previous stage finishes operation, the transistor PT1 and the transistor PT2 are turned off, the transistor PT11 and the transistor PT12 are turned off, the voltage of the first node Q(N) is held at a low voltage level by the bootstrap capacitor C1. It can be seen from FIG. 6, during waiting for the first clock signal CK(M), the low voltage level of the first node Q(N) should be held in a period of two clock pulses, the circuit of the first clock signal of the present second embodiment, adding a second node H(N) to store a voltage level based on the conventional circuit such that the source electrode of the transistor PT2 and the source electrode of the transistor PT7 connected with the first node Q(N) are both at a low voltage level, the current leakage path does not exist, reducing the risk of the circuit failure;

During the low voltage level of the first node Q(N) is held, the transistor PT4 is turned on, when the low voltage level of the first clock signal CK(M) is inputted, the voltage level of the first node Q(N) will continue to decrease because of the bootstrap function of the bootstrap capacitor C1, and outputting the low voltage level of the scanning driving signal Gate(N) of the current stage through the transistor PT4.

When the operation of the low voltage level of the first clock signal CK(M) is finished, a low voltage level of the second clock signal CK(M+1) is inputted, the transistor PT11 and the transistor PT12 are turned on, the drain electrode of the transistor PT1 is pulled up to the high voltage level of the second voltage by the second reference voltage level VGH through the transistor PT12, the transistor PT5 and the transistor PT8 are turned off, the high voltage level of the first reference voltage VGL sets the third node P(N) as the low voltage level of the first voltage through the transistor PT11;

The low voltage level of the third node P(N) make the transistor PT9 and the transistor PT7 to be turned on, the first node Q(N) is pulled up to the high voltage level of the second voltage by the second reference voltage level VGH through the transistor PT7 and the transistor PT9, the second node H(N) is pulled up to the high voltage level by the second reference voltage level VGH through the transistor PT9, the high voltage level of the second node H(N) is not enough to turn off the transistor PT6, the high voltage level of the source electrode of the transistor PT6 will speed up the pullup of the voltage level of the second node H(N).

The low voltage level of the third node P(N) simultaneously turns on the transistor PT10, the scanning driving signal Gate(N) of the current stage is pulled up to the high voltage level by the second reference voltage level VGH. Thus, one timing cycle of the complete circuit is finished.

The third embodiment of the present invention provides a display panel, including a substrate and a gate driving circuit formed on the substrate, and the gate driving circuit is the gate driving circuit provided at anyone of the above embodiments.

The first embodiment of the present invention and the second embodiment of the present invention respectively use the NMOS gate driving circuit and the PMOS gate driving circuit as examples, but not limited. In another embodiment, based on different principle for realization, the specific circuit structure of the gate driving circuit can be different, the elements in the circuit can also be different, for example, the transistor can select CMOS semiconductor device in order to meet an actual requirement.

The present invention describe a gate driving circuit and a display panel through above three embodiments, the input circuit responds to the scanning driving signal of the previous stage to set the pulling circuit as the first status, and utilizes the first reference voltage level to set the voltage of the first node at the first voltage, and held by the output circuit. The input circuit responds to the scanning driving signal of the previous stage, using the first reference voltage level to set the voltage of the second node as the first voltage, and held by the stabilizing circuit such that the output circuit output the scanning driving signal of the current stage according to the first clock signal. Through above way, the present invention set the voltage of the first node at the first voltage, and set the voltage of the second node at the same time in order to reduce the leakage current between the first node and the second node such that the voltage of the first node can be held at a magnitude within a certain time by the output circuit. When the clock signal is inputted, outputting the scanning driving signal of the current stage to reduce the failure risk of the circuit.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A gate driving circuit, comprising:
an input circuit, an output circuit, a stabilizing circuit, a pulling circuit, a pulling control circuit, wherein the input circuit includes a first switching tube and a second switching tube, and the stabilizing circuit includes a third switching tube;
a first path terminal of the first switching tube is connected with a control terminal of the first switching tube and a control terminal of the second switching tube, and receives the scanning driving signal of the previous stage; a second path terminal of the first switching tube is connected with the pulling circuit, the first switching tube is turned on under an action of the scanning driving signal of the previous stage in order to transfer the scanning driving signal of the previous stage to the pulling circuit to set the pulling circuit in a first status;
a first path terminal of the second switching tube is connected with a first reference voltage level, a second path terminal of the second switching tube is connected with a first node, the first node is connected with the output circuit, the second switching tube is turned on under the action of the scanning driving signal of the previous stage such that the first reverence voltage level set the voltage of the first node as a first voltage, and the voltage of the first node is held by the output circuit such that the output circuit outputs a scanning driving signal of a current stage according to a first clock signal;
a second path terminal of the first switching tube simultaneously connects a control terminal of the third switching tube to receive the scanning driving signal of the previous stage, a first path terminal of the third switching tube connects the first reference voltage level, a second path terminal of the third switching tube connects a second node, the third switching tube is turned on under an action of the scanning driving signal of the previous stage such that the first reference voltage level sets the voltage of the second node as the first voltage, and the voltage of the second node is held by the third switching tube;
the pulling circuit is connected with the second path terminal of the second switching tube at the first node, the pulling circuit is connected with the second path terminal of the third switching tube at the second node, the pulling circuit connects the pulling control circuit, the pulling control circuit responds to a second clock signal to set the pulling circuit in a second status, so as to use a second reference voltage level to pull the voltages of the first node and the second node and hold the voltages of the first node and the second node at a second voltage.

2. A gate driving circuit, comprising:
an input circuit, an output circuit, a stabilizing circuit, a pulling circuit and a pulling control circuit;
the output circuit is connected with the input circuit and the pulling circuit at a first node, the input circuit responds to a scanning driving signal of a previous stage to set the pulling circuit in a first status, using a first reference voltage level to set a voltage of the first node as a first voltage, and the voltage of the first node is held by the output circuit such that the output circuit outputs a scanning driving signal of a current stage according to a first clock signal;
the stabilizing circuit is connected with the pulling circuit at a second node, the input circuit responds to the scanning driving signal of the previous stage, using the first reference voltage level to set the voltage of the second node as the first voltage, and the voltage of the second node is held by the stabilizing circuit so as to reduce a leakage current between the first node and the second node; and
the pulling control circuit responds to a second clock signal to set the pulling circuit in a second status in order to use a second reference voltage level to pull voltages of the first node and the second node and to hold the voltages of the first node and the second node at a second voltage.

3. The gate driving circuit according to claim 2, wherein,
the input circuit includes a first switching tube and a second switching tube;
a first path terminal of the first switching tube is connected with a control terminal of the first switching tube and a control terminal of the second switching tube, and receives the scanning driving signal of the previous stage; a second path terminal of the first switching tube is connected with the pulling circuit, the first switching tube is turned on under an action of the scanning driving signal of the previous stage in order to transfer the scanning driving signal of the previous stage to the pulling circuit to set the pulling circuit in the first status; and a first path terminal of the second switching tube is connected with the first reference voltage level, a second path terminal of the second switching tube is connected with the first node, the second switching tube is turned on under the action of the scanning driving signal of the previous stage such that the first reverence voltage level set the voltage of the first node as the first voltage, the second path terminal of the first switching tube is further connected with the stabilizing circuit, the first switching tube further transfer the scanning driving signal of the previous stage to the stabilizing circuit, controlling the stabilizing circuit to be turned on such that the first reference voltage level set the voltage of the second node as the first voltage, and the voltage of the second node is held by the stabilizing circuit.

4. The gate driving circuit according to claim 3, wherein, the first switching tube is a first transistor, the control terminal of the first switching tube corresponds to a gate electrode of the first transistor, the first path terminal and the second path terminal of the first switching tube respectively correspond to a source electrode and a drain electrode of the first transistor;

the second switching tube is a second transistor, the control terminal of the second switching tube corresponds to a gate electrode of the second transistor, the first path terminal and the second path terminal of the second switching tube respectively correspond to a source electrode and a drain electrode of the second transistor.

5. The gate driving circuit according to claim 3, wherein, the input circuit further includes a third switching tube;

a control terminal of the third switching tube is connected with the first reference voltage level or the second reference voltage level, a first path terminal of the third switching tube is connected with the second path terminal of the second switching tube, a second path terminal of the third switching tube is connected with the first node, the third switching tube is turned on under an action of the first reference voltage level or the second reference voltage level in order to stabilize the voltage of the first node.

6. The gate driving circuit according to claim 5, wherein, the third switching tube is a third transistor, the control terminal of the third switching tube corresponds to a gate electrode of the third transistor, the first path terminal and the second path terminal of the third switching tube respectively correspond to a source electrode and a drain electrode of the third transistor.

7. The gate driving circuit according to claim 2, wherein, the output circuit includes a switching tube and a bootstrap capacitor;

a control terminal of the switching tube is connected with the first node, a first path terminal of the switching tube inputs the first clock signal, the bootstrap capacitor is connected between the control terminal of the switching tube and a second path terminal of the switching tube; when the voltage of the first node is set as the first voltage, the bootstrap capacitor holds the first voltage such that the switching tube is turned on so that the scanning driving signal of the current stage is outputted at the second path terminal of the switching tube according to the first clock signal.

8. The gate driving circuit according to claim 7, wherein, the switching tube is a transistor, the control terminal of the switching tube corresponds to a gate electrode of the transistor, the first path terminal and the second path terminal of the switching tube respectively correspond to a source electrode and a drain electrode of the transistor.

9. The gate driving circuit according to claim 2, wherein, the stabilizing circuit includes a switching tube;

a control terminal of the switching tube is connected with the input circuit to receive the scanning driving signal of the previous stage, a first path terminal of the switching tube is connected with the first reference voltage level, a second path terminal of the switching tube is connected with the second node, the switching tube is turned on under the action of the scanning driving signal of the previous stage such that the first reference voltage level set the voltage of the second node as the first voltage, and the voltage of the second node is held by the switching tube.

10. The gate driving circuit according to claim 9, wherein, the switching tube is a transistor, the control terminal of the switching tube corresponds to a gate electrode of the transistor, the first path terminal and the second path terminal of the switching tube respectively correspond to a source electrode and a drain electrode of the transistor.

11. The gate driving circuit according to claim 9, wherein, the stabilizing circuit further includes another switching tube;

a first path terminal of the another switching tube is connected with the second node and the control terminal of the another switching tube, and a second path terminal of the another switching tube is connected with the input circuit to receive the scanning driving signal of the previous stage, the another switching tube is turned on when the voltage of the second node is set as the first voltage, the another switching tube and the switching tube commonly hold the first voltage.

12. The gate driving circuit according to claim 11, wherein, the another switching tube is another transistor, the control terminal of the another switching tube corresponds to a gate electrode of the another transistor, the first path terminal and the second path terminal of the another switching tube respectively correspond to a source electrode and a drain electrode of the another transistor.

13. The gate driving circuit according to claim 2, wherein, the pulling circuit includes a first switching tube, a second switching tube, a third switching tube, a fourth switching tube and a bootstrap capacitor;

a first path terminal of the first switching tube is connected with the second node, a second path terminal of the first switching tube is connected with the first node, and a control terminal of the first switching tube is connected with a third node;

a control terminal of the second switching tube is connected with the input circuit to receive the scanning driving signal of the previous stage, a first path terminal of the second switching tube is connected with the third node, a second path terminal of the second switching tube is connected with the second reference voltage level;

a control terminal of the third switching tube is connected with the third node, a first path terminal of the third switching tube is connected with the second node, and a second path terminal of the third switching tube is connected with the second reference voltage level;

a control terminal of the fourth switching tube is connected with the third node, a first path terminal of the fourth switching tube is connected with an output terminal of the output circuit, a second path terminal of the fourth switching tube is connected with the second reference voltage level;

the bootstrap capacitor is connected between the third node and the second reference voltage level;

wherein, the second switching tube is turned on under an action of the scanning driving signal of the previous stage such that the second reference voltage level sets a voltage of the third node as the second voltage, the first switching tube, the third switching tube and the fourth switching tube are turned off under an action of the third node such that the first voltage of the first node is held in the output circuit, and the first voltage of the second node is held in the stabilizing circuit;

the pulling control circuit responds to the second clock signal to set the voltage of the third node as the first voltage such that the first switching tube, the third switching tube and the fourth switching tube are turned on such that the second reference voltage level sets the voltages of the first node and the second node as the second voltage.

14. The gate driving circuit according to claim 13, wherein, the first switching tube is a first transistor, the control terminal of the first switching tube corresponds to a gate electrode of the first transistor, the first path terminal and the second path terminal of the first switching tube respectively correspond to a source electrode and a drain electrode of the first transistor;

the second switching tube is a second transistor, the control terminal of the second switching tube corresponds to a gate electrode of the second transistor, the first path terminal and the second path terminal of the second switching tube respectively correspond to a source electrode and a drain electrode of the second transistor;

the third switching tube is a third transistor, the control terminal of the third switching tube corresponds to a gate electrode of the third transistor, the first path terminal and the second path terminal of the third switching tube respectively correspond to a source electrode and a drain electrode of the third transistor; and the fourth switching tube is a fourth transistor, the control terminal of the fourth switching tube corresponds to a gate electrode of the fourth transistor, the first path terminal and the second path terminal of the fourth switching tube respectively correspond to a source electrode and a drain electrode of the fourth transistor.

15. The gate driving circuit according to claim 13, wherein, the pulling control circuit includes a fifth switching tube and a sixth switching tube;

a first path terminal of the fifth switching tube is connected with the third node, a second path terminal of the fifth switching tube is connected with the first reference voltage level, a first path terminal of the sixth switching tube is connected with the stabilizing circuit, a second path terminal of the sixth switching tube is connected with the second reference voltage level, a control terminal of the fifth switching tube and a control terminal of the sixth switching tube receive the second clock signal;

the sixth switching tube is turned on under an action of the second clock signal such that the second reference voltage level control the stabilizing circuit to remove holding of the first voltage through the sixth switching tube; and the fifth switching tube is turned on under the action of the second clock signal such that the first reference voltage level set the voltage of the third node as the first voltage through the fifth switching tube such that the first switching tube, the third switching tube and the fourth switching tube are turned on so as to use the second reference voltage level to set the voltages of the first node and the second node as the second voltage.

16. The gate driving circuit according to claim 15, wherein, the fifth switching tube is a fifth transistor, the control terminal of the fifth switching tube corresponds to a gate electrode of the fifth transistor, the first path terminal and the second path terminal of the fifth switching tube respectively correspond to a source electrode and a drain electrode of the fifth transistor; and the sixth switching tube is a sixth transistor, the control terminal of the sixth switching tube corresponds to a gate electrode of the sixth transistor, the first path terminal and the second path terminal of the sixth switching tube respectively correspond to a source electrode and a drain electrode of the sixth transistor.

17. The gate driving circuit according to claim 2, wherein, the first reference voltage level is one of a high reference voltage level and a low reference voltage level, and the second reference voltage level is the other of the high reference voltage level and the low reference voltage level.

18. The gate driving circuit according to claim 2, wherein, the first voltage is one of a high voltage level and a low voltage level, and the second voltage is the other of the high voltage level and the low voltage level.

19. A display panel comprising a substrate and a gate driving circuit as claimed in claim 1 on the substrate.

* * * * *